US007920373B2

(12) United States Patent
Matsubara

(10) Patent No.: US 7,920,373 B2
(45) Date of Patent: Apr. 5, 2011

(54) COVER UNIT, ELECTRONIC DEVICE, AND IMAGE FORMING APPARATUS

(75) Inventor: Mitsuya Matsubara, Chigasaki (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/728,360

(22) Filed: Mar. 22, 2010

(65) Prior Publication Data

US 2010/0246109 A1 Sep. 30, 2010

(30) Foreign Application Priority Data

Mar. 26, 2009 (JP) ................................ 2009-076267

(51) Int. Cl.
*H05K 5/00* (2006.01)
*H05K 7/00* (2006.01)

(52) U.S. Cl. .............................. 361/679.01; 361/679.58

(58) Field of Classification Search ............. 361/679.01, 361/679.21, 679.58
See application file for complete search history.

(56) References Cited

U.S. PATENT DOCUMENTS 7,580,249 B2 * 8/2009 Tsuji ........................ 361/679.21
2008/0232050 A1 * 9/2008 Muraki ......................... 361/681

FOREIGN PATENT DOCUMENTS

| | | |
|---|---|---|
| JP | 2800646 | 7/1998 |
| JP | 3919734 | 2/2007 |
| JP | 2007-268982 | 10/2007 |
| JP | 2008-255566 | 10/2008 |

* cited by examiner

*Primary Examiner* — Jayprakash N Gandhi
*Assistant Examiner* — Anthony M Haughton
(74) *Attorney, Agent, or Firm* — Cooper & Dunham LLP

(57) ABSTRACT

A cover unit to open and close an opening formed in a main body includes a cover including a hinged first end portion, a second end portion including an engagement portion provided on a side facing the opening, and a deformable portion deformable toward the main body, provided in the second end portion, a rotation stopper disposed between the cover and the opening, to inhibit the cover from rotating excessively, and a push latch unit disposed in the main body to lock and unlock the cover, including an engagement pawl to contact the engagement portion of the cover when the rotation stopper prohibits the cover from rotating further to the main body. When the second end portion is pressed while the rotation stopper prohibits the cover from rotating, the engagement portion of the cover is engaged or disengaged from the engagement pawl of the push latch unit.

11 Claims, 7 Drawing Sheets

COVER UNIT, ELECTRONIC DEVICE, AND IMAGE FORMING APPARATUS

CROSS-REFERENCE TO RELATED APPLICATIONS

This patent specification claims priority to Japanese Patent Application. No. 2009-076267, filed on Mar. 26, 2009 in the Japan Patent Office, the contents of which are hereby incorporated by reference herein in its entirety.

BACKGROUND OF THE INVENTION

1. Field of the Invention

The present invention generally relates to a structure to open and close a cover with respect to a main body, an electronic device including the structure, and an image forming apparatus such as a copier, a printer, a facsimile machine, etc., that includes the structure.

2. Discussion of the Background Art

Cover units to open and close a cover of an opening formed in a main body using a push latch device are widely used in electronic devices such as image forming apparatuses, in addition to various cabinets such as television cabinets. Generally, one end of the cover is rotatably hinged to the main body with a shaft, and an engagement portion is provided in the opposite end of the cover. The engagement portion is engaged and disengaged from the push latch device when pressed, and thus the cover is locked to and unlocked from the main body.

In certain known cover units, the cover is locked when pressed while being rotated from an open position to a close position and unlocked when the closed cover is pressed. In this type of cover units, although users can open and close the cover easily, a certain amount of clearance should be kept between the cover and the main body to allow the cover to move when the engagement between the cover and the latch of the push latch unit is released. Therefore, where the cover is to be pushed to unlocked the cover is not precisely limited to the area around the engagement portion (e.g., lock portion). Consequently, if this cover unit is used in electronic devices, it can happen that the cover is accidentally unlocked when the user contacts the cover unintentionally, and accordingly the electronic device stops even if an operation is in progress.

Other certain known cover units use a push latch unit that is attached to the main body and includes a pushing rod movable to and away from the cover, a slider movable with the pushing rod, and a hook lever rotatable in conjunction with the slider between a release position in the main body and an engagement position outside the main body. The engagement portion provided on a back surface or inner surface of the cover includes a guide recess to guide an engagement pawl formed on the edge of the hook lever and an engagement part to engage the engagement pawl guided by the guide recess. This cover unit is used in ink-ejecting printers, for example.

In this known cover unit, the cover can be opened accidentally with incidental contact. Additionally, using the hook lever increases the number of components. Although the cover unit can be configured to lock the cover electrically, such a configuration also increases the number of components, and accordingly the size of the unit increases.

Therefore, there is a need for a cover unit capable of preventing the cover from being opened by unintended contact by the user and employing a relatively simple configuration, which known approaches fail to do.

SUMMARY OF THE INVENTION

In view of the foregoing, one illustrative embodiment of the present invention provides a cover unit.

The cover unit includes a cover to open and close an opening formed in a main body by rotating around a shaft, a rotation stopper disposed between the cover and the opening, to inhibit the cover from rotating, and a push latch unit disposed in the main body to lock and unlock the cover. The cover includes a first end portion hinged by the shaft to the main body, a second end portion opposite the first end portion, including an engagement portion provided on a side facing the opening in the main body, and a deformable portion provided in the second end portion, deformable toward the main body when pressed. The push latch unit includes an engagement pawl to contact the engagement portion of the cover when the rotation stopper prohibits the cover from rotating excessively to the main body. When the second end portion is pressed while the rotation stopper prohibits the cover from rotating, the engagement portion of the cover pushes and overstrides the engagement pawl and is engaged or disengaged from the engagement pawl of the push latch unit.

In another embodiment, the cover unit described above is incorporated in an electronic device.

Yet in another embodiment, the cover unit described above is incorporated in an image forming apparatus.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
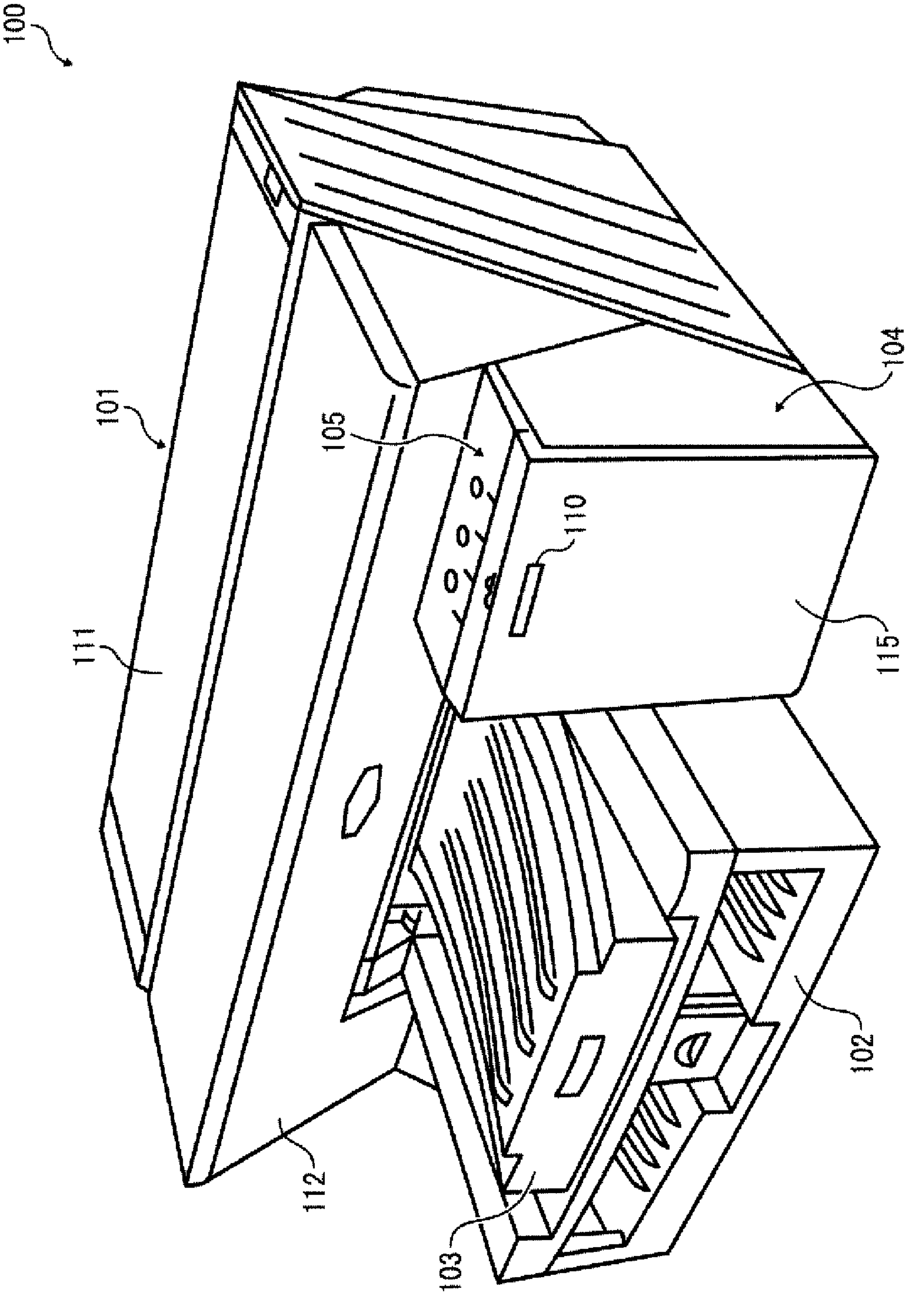
FIG. 1 is a perspective view illustrating an ink-ejecting recording device including a cover unit according to an illustrative embodiment of the present invention.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views thereof, and particularly to FIG. 1, an image forming apparatus including a cover unit according to an illustrative embodiment of the present invention is described.

Figure 2:
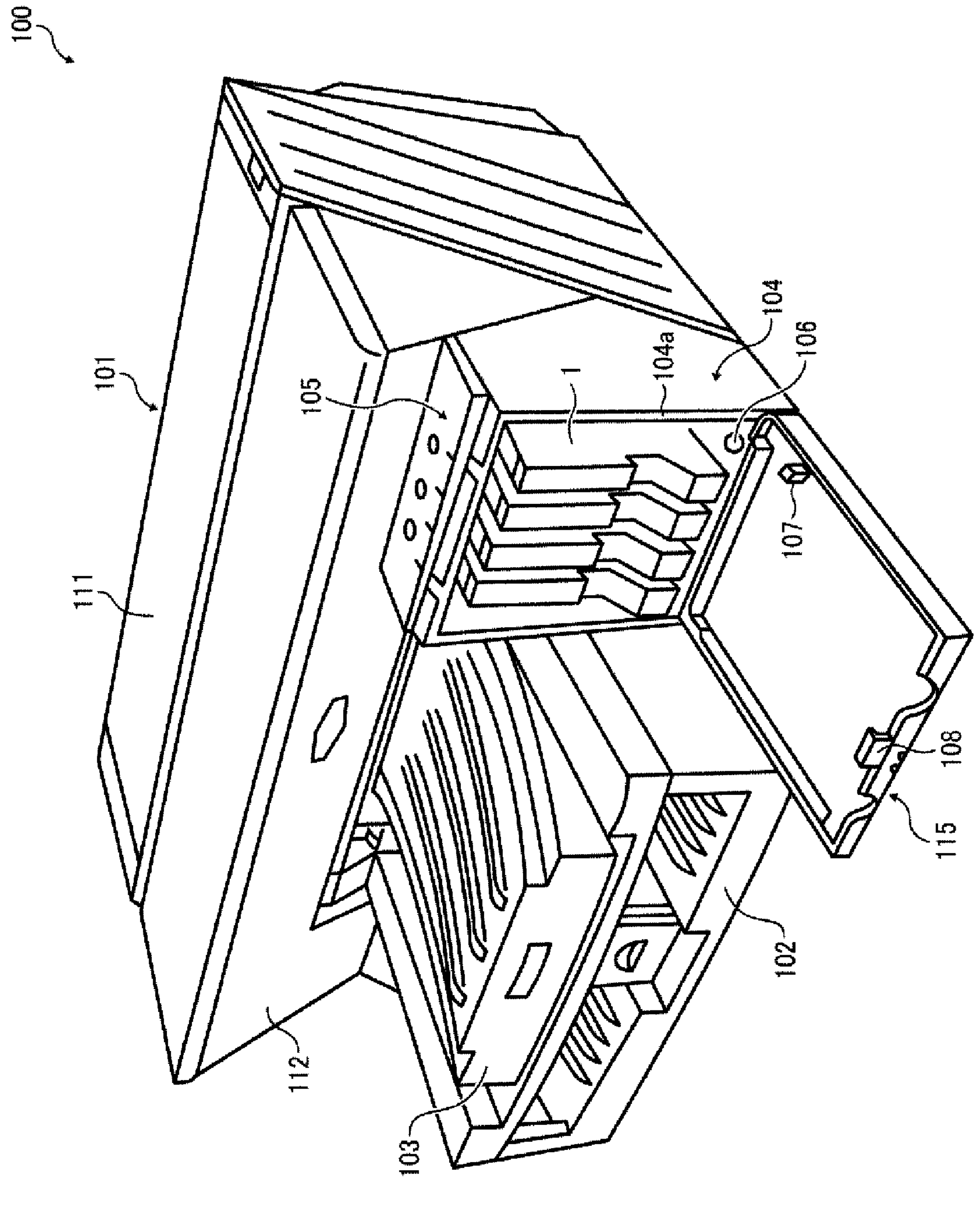
FIG. 2 illustrates the ink-ejecting recording device shown in FIG. 1 in which a front cover is open.

FIG. 1 is a perspective view illustrating an ink-ejecting recording device 100 as an image forming apparatus according to the present embodiment, and FIG. 2 illustrates the ink-ejecting recording device 100 in which a front cover 115 is open.

The ink-ejecting recording device 100 includes a main body 101 containing an image forming unit configured to form images on sheets of recording media, a feed tray 102 from which sheets are fed to the main body 101, and a discharge tray 103 to which sheets are discharged after images are formed thereon. The feed tray 102 and the discharge tray 103 are detachably attached to the main body 101. FIGS. 1 and 2 illustrate a front side of the ink-ejecting recording device 100. An upper cover 111 forms an upper side of the main body 101 and its upper surface is substantially flat, and a front surface 112 on the front side of the main body 101 is recessed obliquely from the upper cover 111 as it descends. The feed tray 102 and the discharge tray 103 are disposed in a lower portion of the front surface 112 and project from the front surface 112.

The ink-ejecting recording device 100 further includes a cartridge mount 104 disposed in an edge portion, on the side of the sheet feed tray 102 and the discharge tray 103, beneath the upper cover 111, projecting from the front surface 112 of the main body 101. An operation unit 105 is formed on an upper side of the cartridge mount 104 and includes operation keys and indicators.

A front side of the cartridge mount 104 serves as an opening formed in the main body 101. In FIG. 2, a reference character 104*a* represents a flanged edge of the cartridge mount 104. The front cover 115, serving as an openably closable cover, is provided on the front side of the cartridge mount 104 for replacement of ink cartridges 1 serving as ink containers that are detachably installed within a recessed portion of the cartridge/tank mount 4. Rotary shaft portions 305 serving as a rotary shaft is provided in a first end portion of the front cover 115 and engage respective shaft engagement slots (shaft engagement portions), not shown, provided in the cartridge mount 104, and thus the front cover 115 is rotatably hinged to the main body 101 (cartridge mount 104). In the present embodiment, a lower end portion of the front cover 115 is hinged to the main body 101. When the front cover 115 is rotated around the rotary shaft portions 305, the front cover 115 is opened or closed with respect to the cartridge mount 104.

Additionally, a detection recess 106 is formed in the cartridge mount 104 (main body 101), and a projection 107 formed on an inner surface of the front cover 115 engages the detection recess 106 when the front cover 115 is closed. In the present embodiment, the projection 107 and the detection recess 106 together form a cover state detector to detect whether the front cover 116 is open or closed. More specifically, an optical sensor, for example, a so-called photo-interrupter, is provided in the detection recess 106. The presence of the projection 107 in the detection recess 106 can be detected because the projection 107 blocks the light emitted from an light-emitting element to a light-receiving element when the projection 107 is in the detection recess 106. Thus, whether the front cover 115 is open or closed can be known by detecting whether or not the projection 107 is disengaged from the detection recess 106.

Additionally, a locking projection 108 shaped like a hook is provided in a second end portion or upper portion of the front cover 115 opposite the first end portion hinged with the rotary shaft portions 305 in a direction perpendicular to a direction, indicated by arrow R shown in FIG. 4, which is axis of rotation of the front cover 115 (hereinafter "rotary axial direction). The locking projection 108 engages a push latch unit 400 (shown in FIG. 3) provided in a center portion of an upper end portion of the opening of the cartridge mount 104. Additionally, a push-position indicator 110 that can be a recess or a projection is provided on an outer surface of the second end portion of the front cover 115 to indicate a position to be pushed when the front cover 115 is opened. The push-position indicator 110 is disposed at a position facing the push latch unit 400 or adjacent thereto.

The ink-ejecting recording device 100 further includes a controller to control respective portions although not shown in drawings.

Next, the push latch unit 400 provided in the cartridge mount 104 is described below with reference to FIGS. 3A and 3B.

Figure 3A:
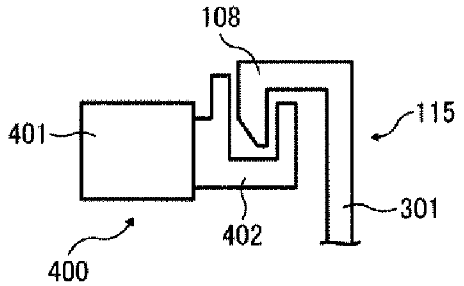
FIG. 3A is a cross-sectional diagram illustrating main components of a push latch unit engaged with the front cover.
Figure 3B:
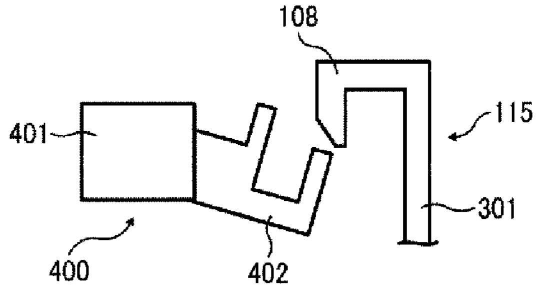
FIG. 3B is a cross-sectional diagram illustrating the main components of the push latch unit disengaged from the front cover.
Figure 4:
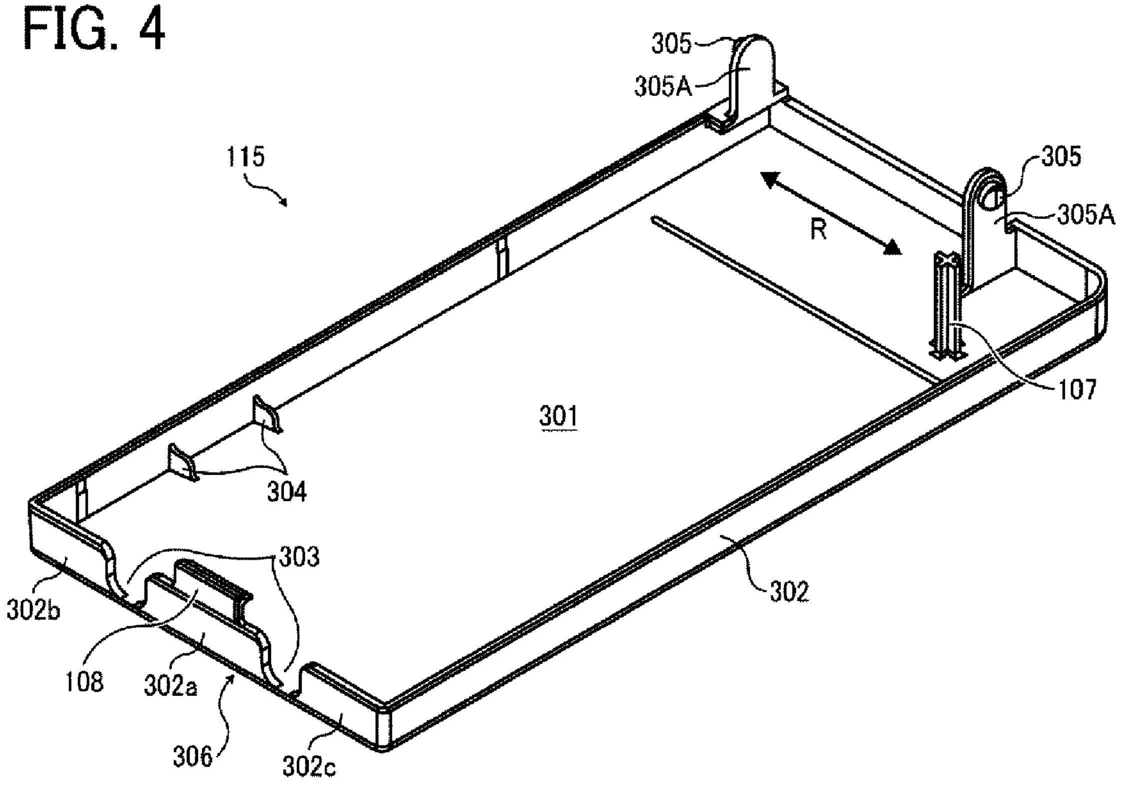
FIG. 4 is a perspective view illustrating the front cover.

FIGS. 3A and 3B are cross-sectional diagrams illustrating main components of the push latch unit 400. FIGS. 3A and 3B illustrate states in which the locking projection 108 is engaged with the push latch unit 400 (e.g., in an engagement state or locked state) and disengaged therefrom (e.g., in a disengagement state or release state).

The push latch unit 400 includes a latch body 401 and an engagement pawl 402 that is engaged and disengaged from the locking projection 108 of the front cover 115. The latch body 401 includes a hold mechanism to keep the engagement pawl 402 in the locked state shown in FIG. 3A where the engagement pawl 402 engages the locking projection 108 and in the release state shown in FIG. 3B. When the push latch unit 400 at the hold position shown in FIG. 3A is pushed, the push latch unit 400 moves to the position shown in FIG. 3B. That is, the engagement pawl 402 is disengaged from the locking projection 108 and positioned at the left of the locking projection 108, which is forward of the locking projection 108 on the front side of the ink-ejecting recording device 100. Additionally, when the push latch unit 400 is in the release state shown in FIG. 3B, the hold mechanism keeps the engagement pawl 402 tilted with its right end portion FIG. 3B lower than its left end portion in FIG. 3B. It is to be noted that the latch body 401 has a known mechanism and known internal configuration, and thus descriptions thereof are omitted.

Next, the front cover 115 is described in further detail below. FIG. 4 is a perspective view illustrating the front cover 115 that is openably closable with respect to the main body 101 of the ink-ejecting record device 100 according to the present embodiment. The front cover 115 is formed with an elastic member such as elastic resin. Examples of the material of the front cover 115 include polycarbonate (PC) and acrylonitrile-butadiene-styrene. The rotary shaft portions 305 are respectively project from standing portions 305A provided in the first end portion, that is, the lower end portion, of the front cover 115, and the locking projection 108 engaging the push latch unit 400 is formed in the opposite end portion in the direction perpendicular to the rotary axial direction.

The front cover 115 is an integrated single member formed with a planar body 301, a fence 302, serving as a raised edge, surrounding the planar body 301, the standing portions 305A, the rotary shaft portions 305 provided on the respective standing portions 305A, configured to rotatably engage the respective shaft engagement slots (not shown) provided in the cartridge mount 104, the locking projection 108 extending from an upper side 306 of the fence 302.

Figure 6A:
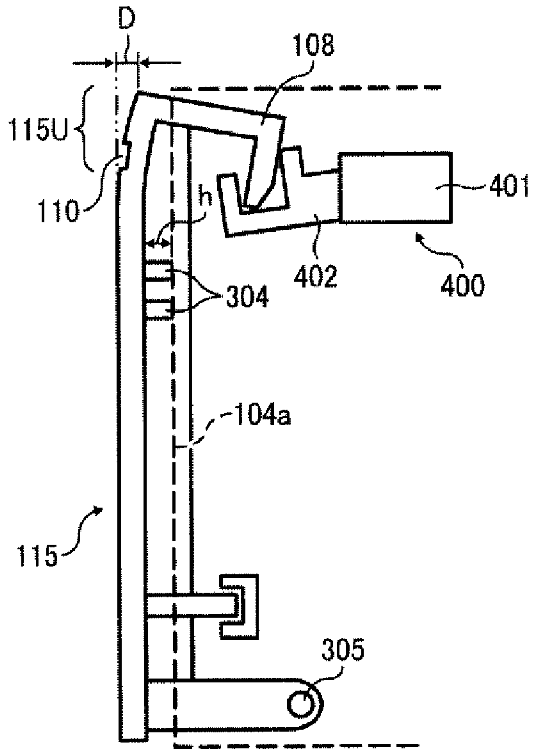
FIGS. 6A and 6B are cross-sectional views illustrating release of the front cover from the push latch unit and engagement of the front cover with the push latch unit, respectively.

Additionally, a pair of cutouts 303 are formed in the upper side 306 of the fence 302 and disposed on both sides of the locking projection 108. With the cutouts 303, the upper side 306 is divided into a center portion 302*a* and side portions 302*b* and 302*c*. Although the fence 302 prevents the front cover 115 from curving toward the opening 104 if the cutouts 303 are not formed, an upper portion 115U positioned in the second end portion of the front cover 115, that is, a portion around the cutouts 303, can deform as shown in FIGS. 6A and 7B in the present embodiment. The upper portion 115U serves as a deformable portion and includes the posh-position indicator 110. Because the front cover 115 is thus configured to curve, cracks in the front cover 115 can be prevented by forming the front cover 115 with elastic material as described above and limiting the area to be curved to the upper portion 115U.

The front cover 115 further includes rotation stopping projections 304, serving as rotation stoppers, that project from an inner surface of the planar body 301. Alternatively, the rotation stopping projections 304 may project from respective inner surfaces of the fence 304. When the front cover 115 is closed, the rotation stopping projections 304 contact the flanged edge 104*a* (shown in FIG. 2) of the cartridge mount 104 and thus stop the front cover 115 from rotating further. Although hidden by the fence 302, the rotation stopping projections 304 are provided also on the opposing side, that is, inside the fence 302 on the right in FIG. 4, in the present embodiment. The rotation stopping projections 304 are disposed in both end portions of the planar body 301 in the rotary axial direction of the front cover 115, indicated by arrow R shown in FIG. 4.

The rotation stopping projections 304 are described in further detail below with reference to FIGS. 5A through 6B.

Figure 5A:
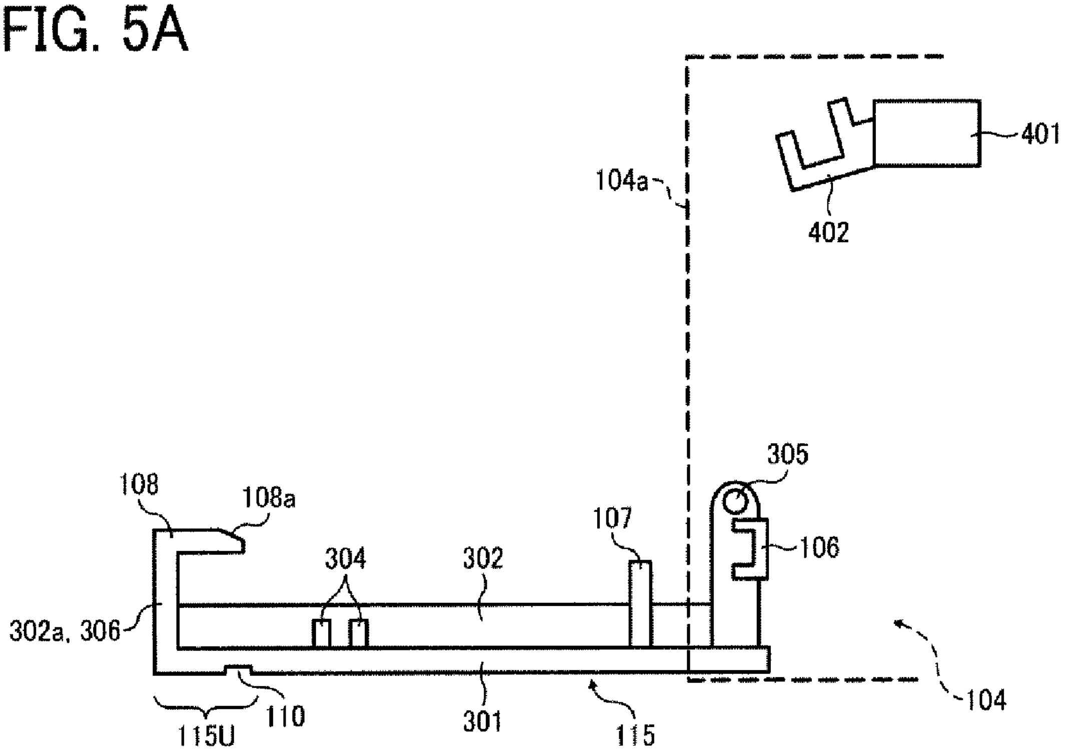
FIGS. 5A and 5B are cross-sectional views illustrating the front cover that is open and closed, respectively.
Figure 5B:
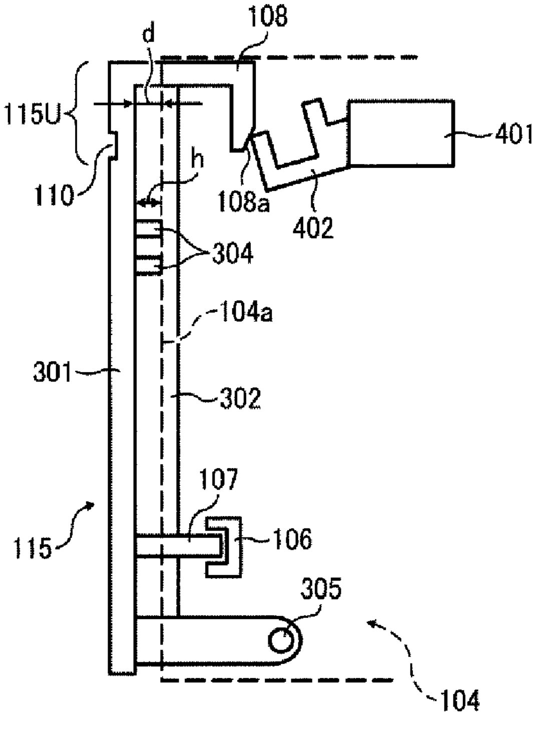

FIGS. 5A and 5B are cross-sectional views illustrating the front cover 115 that is open and closed, respectively. The rotation stopping projections 304 are positioned between the rotary shaft portions 305 and the upper portion 115U of the front cover 115 in a direction perpendicular to the rotary axial direction of the front cover 115 when the rotation stopping projections 304 contact the flanged edge 104*a* of the cartridge mount 104, thereby prohibiting the rotation of the front cover 115. That is, the position of the rotation stopping projections 304 are determined according to the position and the size of the upper portion 115U to be deformed.

Referring to FIG. 5B, the rotation stopping projections 304 have a height h identical or equivalent to a distance d between the planar body 301 and the flanged edge 104*a* of the cartridge mount 104 when the rotation stopping projections 304 contact the flanged edge 104*a*. The height h of the rotation stopping projections 304 is a length in the direction perpendicular to the inner surface of the planar body 301. In FIG. 5A, a reference character 108*a* represents an edge portion of the locking projection 108.

Figure 6B:
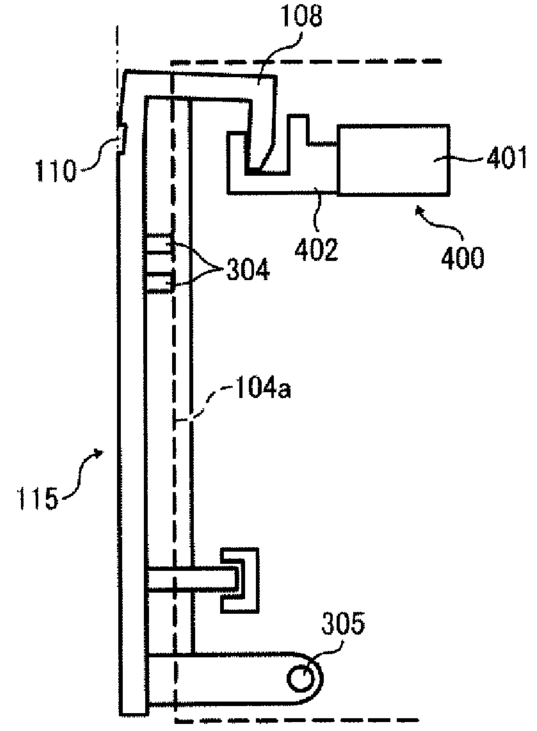

FIGS. 6A and 6B are cross-sectional views illustrating release of the locking projection 108 from the push latch unit 400 and engagement of the locking projection 108 with the push latch unit 400, respectively.

Referring to FIG. 6A, the upper portion 1150 of the front cover 115 curves toward the cartridge mount 104. The height h of the rotation stopping projections 304 is set to a distance D by which the upper portion 1150 (deformable portion) deforms to cause the locking projection 108 to push the engagement pawl 402, thereby locking and unlocking the front cover 115 while the rotation stopping projections 304 contact the flanged edge 104*a* of the cartridge mount 104.

Next, opening and closing the front cover 115 for the replacement of the ink cartridges 1 in the ink-ejecting recording device 100 are described below with reference to FIGS. 5A through 7B.

Figure 7A:
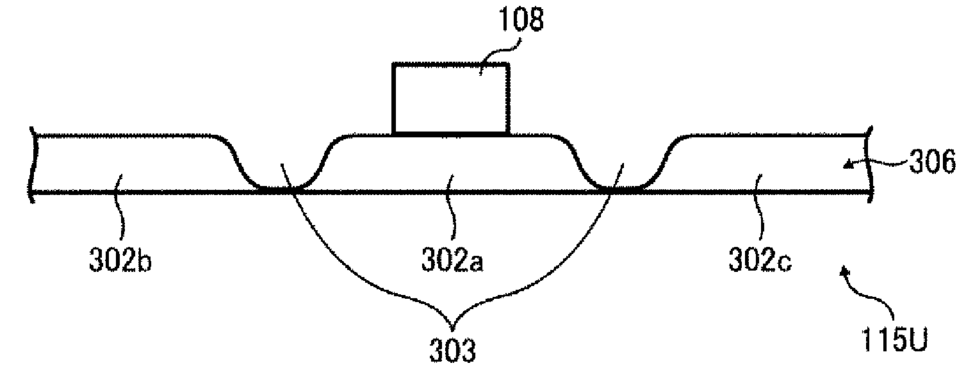
FIGS. 7A and 7B are schematic overhead views illustrating a configuration around a locking projection of the cover that is not deformed in FIG. 7A and is deformed in FIG. 7B.
Figure 7B:
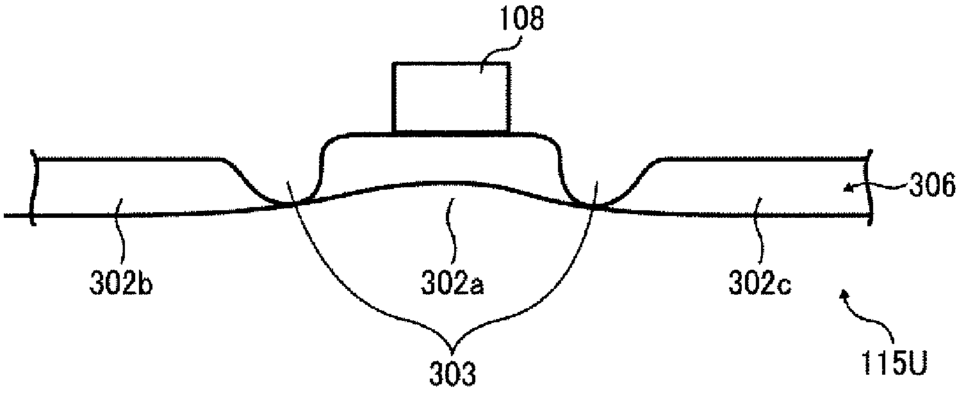

FIGS. 7A and 7B are schematic overhead views illustrating a configuration around the locking projection 108. The upper portion 115U is not deformed in FIG. 7A but is deformed in FIG. 7B.

The front cover 115 that is open as shown in FIG. 5A can be closed by rotating around the rotary shaft portions 305 to the position shown in FIG. 5B (closed position). When the front cover 115 is rotated from the open position shown in FIG. 5A, the rotation stopping projections 304 contact the flanged edge 104*a* of the cartridge mount 104 and thus prohibit the front cover 115 from rotating further. At this time, the engagement pawl 402 is tilted with its left end portion in FIG. 5B lower than its right end portion in FIG. 5B, and the locking projection 108 is not yet engaged with the engagement pawl 402 as shown in FIG. 5B. At this time, the upper portion 115U of the front cover 115 is not yet deformed as shown in FIG. 7A.

In this state, when the user pushes the push-position indicator 110 or the adjacent area, the upper portion 115U of the front cover 115 deforms as shown in FIGS. 6A and 7B, and accordingly the center portion 302*a* approaches the main body 101 (shown in FIG. 1). Then, the locking projection 108 overstrides and engages the engagement pawl 402 of the push latch unit 400 as shown in FIG. 6A, after which, the center portion 302 returns to the state shown in FIG. 7A due to elastic force when the user stops pressing the front cover 115, and the locking projection 108 remains caught in the engagement pawl 402 as shown in FIG. 6B. As a result, the closed front cover 115 is locked by the push latch unit 400.

Also, to unlock the front cover 115 from the state shown in FIG. 6B, the user pushes the push-position indicator 110 or the adjacent area. Then, the upper portion 115U deforms to cause the locking projection 108 to push the engagement pawl 402, thereby disengaging the locking projection 108 from the engagement pawl 402, and the engagement pawl 402 is tilted as shown in FIG. 5A. As a result, the front cover 115 is unlocked and can be opened. It is to be noted that, in FIGS. 5A through 6B, the cartridge mount 104 and the flanged edge 104*a* are indicated by broken lines for simplicity.

Additionally, when the front cover 115 is open as shown in FIG. 5A, because the projection 107 formed on the front cover 115 is not inserted in the detection recess 106 formed in the cartridge mount 104, the controller, not shown, can detect that the front cover 115 is open. Accordingly, the main body 101 does not perform image formation even when the ink-ejecting recording device 100 receives commands for image formation. At this time, the push latch unit 400 is at the disengagement state and the end portion of the engagement pawl 402 is tilted down.

After the ink cartridges 1 are replaced, when the front cover 115 is rotated form the open position shown in FIG. 5A, the rotary shaft portions 305 slide along the respective shaft engagement slots (not shown) provided in the cartridge mount 104 to the position shown in FIG. 5B. Then, the rotation stopping projections 304 contact the flanged edge 104*a* and prohibit the rotary shaft portions 305 from rotating further. Simultaneously, the projection 107 is fully inserted in the detection recess 106. In this state, although the controller, not shown, detects that the front cover 115 is closed because the projection 107 is inserted in the detection recess 106, the front cover 115 is not locked by the push latch unit 400. More specifically, the edge portion 108*a* of the locking projection 108 shown in FIG. 5A presses against the engagement pawl 402 with only such a degree of force that locking projection 108 does not overstride the engagement pawl 402, that is, the locking projection 108 does not engage with the push latch unit 400. At this time, the front cover 115 viewed from above is not deformed as shown in FIG. 7A.

When the user pushes the push-position indicator 110 positioned in a center portion of the front cover 115 in the rotary axial direction to match the position of the push latch unit 400 or the adjacent area from this state, an area around the center portion 302*a* and the side portions 302*b* and 302*c* in the upper portion 115U, positioned above the rotation stopping projections 304 in FIG. 6A, deform as shown in FIG. 7B because of the cutouts 303. Consequently, the locking projection 108 extending from the center portion 302*a* engages the engagement pawl 402 and is locked as shown in FIG. 6B.

When the user stops pressing the front cover 115, the deformed upper portion 115U of the front cover 115 returns to the left in FIG. 7B to a certain extent, and thus locking is secured. That is, the upper portion 115U of the front cover 115 is kept deformed slightly compared with a portion of the front cover 115 lower than the rotation stopping projections 304. A comparative example in which the rotation stopping projections 304 are not provided is described below.

If the rotation stopping projections 304 are not provided, when the front cover 115 is closed, the distance by which the entire front cover 115 rotates around the rotary shaft portions 305 increases by a distance corresponding to the height of the rotation stopping projections 304. That is, the position of the front cover 115 to be pushed to lock and unlock the front cover 115 is not limited to the upper portion 115U.

Therefore, the front cover 115 at the closed position can be locked also when a given position of the front cover 115 except the upper portion 115U is pressed. Similarly, when a center portion or a lower portion of the locked front cover 115 except the upper portion 115U is pressed, the front cover 115 can be unlocked because the entire front cover 115 can further rotate the distance corresponding to the height of the rotation stopping projections 304.

By contrast, in the present embodiment, with the above-described configuration, initially the front cover 115 is rotated until the rotation stopping projections 304 contact the flanged edge 104*a* when the front cover 115 is closed. Then, the front cover 115 is locked by the push latch unit 400 by pressing and deforming the upper portion 115U of the front cover 115 toward the main body 101.

Additionally, in the present embodiment, when the user tries to open the front cover 115, if the front cover 115 is pressed in a portion around or beneath the rotation stopping projections 304, the front cover 115 does not rotate because the rotation stopping projections 304 contact the flanged edge 104*a*. In the present embodiment, to unlock the front cover 115, the user should press the push-position indicator 110 or the adjacent area, deforming the upper portion 115U as shown in FIG. 7B. Then, the locking projection 108 pushes the engagement pawl 402 of the push latch unit 400 as shown in FIG. 6A and overstrides outside the engagement pawl 402, thus disengaged from the push latch unit 400. Subsequently, the front cover 115 can be opened by rotating down.

According to the present embodiment, the front cover 115 can be opened only when the user pushes the push-position indicator 110 or the adjacent area. That is, the push latch unit 400 is pressed by deforming the upper portion 115U. Because the push latch unit 400 cannot be pressed by portions other than the upper portion 11515 (deformable portion), accidental opening of the front cover 115, which can occur when the user contacts the front cover 115 unintentionally, can be prevented with a relatively simple configuration in the present embodiment. Although the ink-ejecting recording device 100 stops any going operation if the front cover 115 is accidentally opened, such inconveniences can be prevented in the present embodiment.

It is to be noted that, although the description above concerns the configuration in which the position of the push-position indicator 110 in the rotary axial direction of the front cover 115 is within the center portion 302*a*, the pressed position of the front cover 115 in that direction may correspond to the cutouts 303 or side portions 3026 or 302*c*. Also in such a case, as the pressed portion deforms due to the effect of the cutouts 303, the center portion 302*a* deforms, causing the edge portion 108*a* of the locking projection 108 to push the engagement pawl 402. Thus, the front cover 115 can be locked and unlocked.

Thus, in the present embodiment, the front cover 115 serving as a cover, a push latch unit 400 disposed in the main body 101, configured to lock and unlock the front cover 115, and the rotation stopping projections 304, serving as the rotation stopper, together form a cover unit. The front cover 115 includes the first end portion hinged with the rotary shaft portions 305 to the main body 101, and a locking projection 108 provided in the second end portion opposite the first end portion, configured to engage the main body 101. The push latch unit 400 includes an engagement pawl 402 to contact the locking projection 108 when the rotation stopping projection 304 prohibits the front cover 115 from rotating. The rotation stopping projection 304 is disposed between the front cover 115 and the opening in the rotary axial direction of the front cover 115, to inhibit the front cover 115 from rotating before the locking projection 108 is engaged with the push latch unit 400.

Additionally, the deformable upper portion 115U deformable toward the main body 101 is provided in the second end portion. When the upper portion 115U is pressed while the rotation stopping projection 304 prohibits the front cover 115 from rotating, the locking projection 108 of the front cover 115 pushes and overstrides the engagement pawl 402, thus engaged or disengaged from the engagement pawl 402. Accordingly, the front cover 115 is locked and unlocked.

Figure 8A:
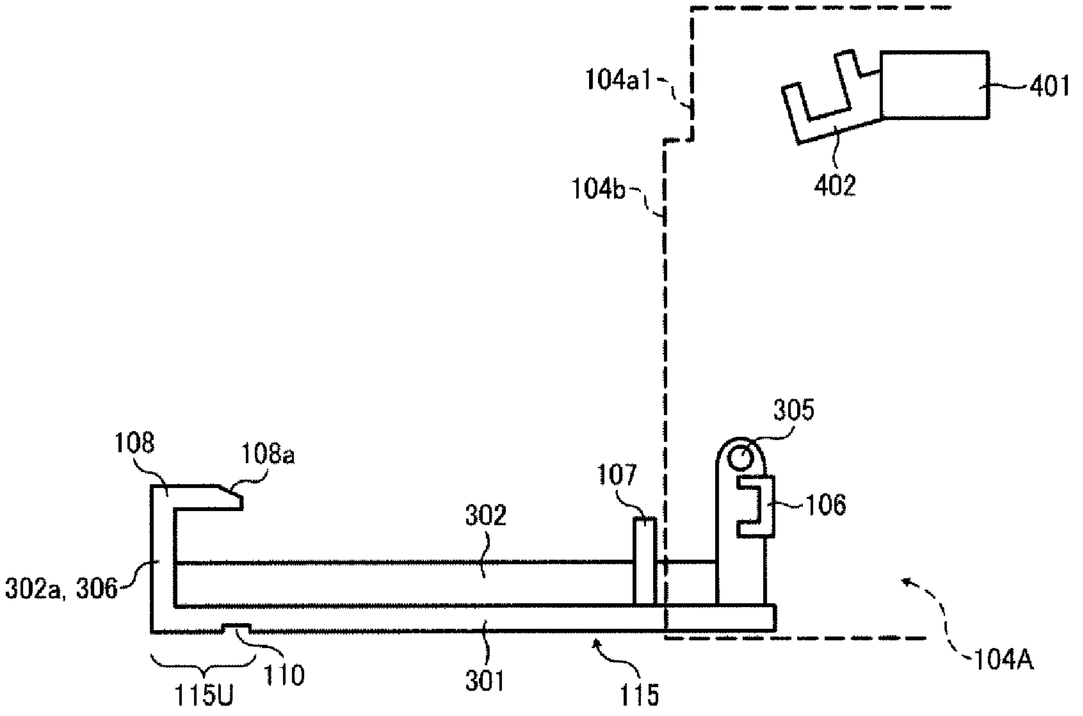
FIGS. 8A and 8B are cross-sectional views illustrating a cover unit according to another illustrative embodiment in which a front cover is open and closed, respectively.
Figure 8B:
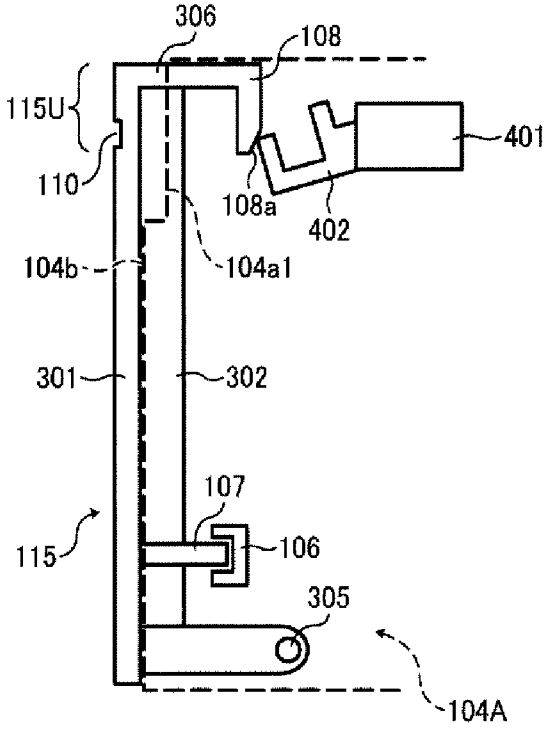

Another embodiment is described below with reference to FIGS. 8A and 8B. FIGS. 8A and 8B are cross-sectional views illustrating a front cover 115A that is open and closed, respectively, with respect to a cartridge mount 104A. The present embodiment is different from the above-described embodiment shown in FIGS. 4 through 7B in that steps 104*b* formed partly on an flanged edge 104*a*1 serve as a rotation stopper instead of the rotation stopping projections 304. Other than that, the present embodiment has a configuration similar to that of the above-described embodiment shown in FIGS. 4 through 7B, and thus the description thereof is omitted.

In the present embodiment, the steps 1046 are formed on both sides of the flanged edge 104*a*1, which are a front side and a back side of paper on which FIGS. 8A and 8B are drawn, so that the front cover 115A can be unlocked only when the user presses the push-position indicator 110 formed in the upper portion of the front cover 115A or the adjacent area. The height, that is, the length from the flanged edge 104*a*1 to a surface of the front cover 115A, of the steps 104*b* can be set similarly to that of the rotation stopping projections 304 in the above-described embodiment. Also in the present embodiment, when the front cover 115A is closed, the front cover 115A rotates until the steps 104*b* formed on the flanged edge 104*a*1 contact the planar body 301 of the front cover 115A, thereby prohibiting the front cover 115A from rotating further as shown in FIG. 8B. Subsequently, when the user pushes the push-position indicator 110 or the adjacent area, the upper portion 115U of the front cover 115A deforms. Accordingly, the locking projection 108 pushes the engagement pawl 402 of the push latch unit 400, overstrides it, and engaged with the push latch unit 400. Thus, the front cover 115A is locked. The locking projection 108 remains engaged with the push latch unit 400 after the user release his/her hand from the front cover 115A.

It is to be noted that, although the description above concerns the configurations in which the rotary shaft portions 305 of the front cover 115 is disposed in the lower end portion, the rotary shaft portions 305 may be disposed in the upper portion, a right end portion, or a left end portion. Additionally, although the description above concerns the configurations including the fence 302, the fence 302 may be omitted.

Although the rotation stopping projections 304 is continuous with the front cover 115 as a single member and the step 104*b* is continuous with the flanged edge 104*a*1 in the descriptions above, the rotation stopper may be a separate member to be attached to the front cover 115 or the flanged edge 104*a*. In this case, the cover unit may be configured so that the pushed position of the front cover to lock and unlock the front cover is adjustable by changing the position of the rotation stopper. Additionally, the load applied to a given portion of the rotation stopper can be reduced by expanding the area in contact with the flanged edge 104*a* or the front cover 115, that is, by increasing the number of the rotation stopping projections 304 or the length of the step 104*b* in the direction perpendicular to the rotary axial direction of the front cover 115.

Moreover, although the cover unit is applied to the image forming apparatus in the description above, the cover units according to the above-described embodiments are applicable to any electronic devices or any structure that includes a cover closably openable with respect to a main body.

Numerous additional modifications and variations are possible in light of the above teachings. It is therefore to be understood that, within the scope of the appended claims, the disclosure of this patent specification may be practiced otherwise than as specifically described herein.

What is claimed is:

1. A cover unit, comprising:
- a cover to open and close an opening in a main body by rotating around a shaft, the cover including:
  - a first end portion hinged by the shaft to the main body,
  - a second end portion opposite the first end portion, including an engagement portion provided on a side facing the opening in the main body, and
  - a deformable portion provided in the second end portion, deformable toward the main body when pressed;
- a push latch unit disposed in the main body to lock and unlock the cover,
- the push latch unit including an engagement pawl to engage the engagement portion of the cover; and
- a rotation stopper disposed between the cover and the opening, to inhibit the cover from rotating before the engagement portion of the cover engages the engagement pawl,
- wherein, when the second end portion is pressed while the rotation stopper prohibits the cover from rotating, the engagement portion of the cover overstrides the engagement pawl and is engaged or disengaged from the engagement pawl of the push latch unit.

2. The cover unit according to claim 1, further comprising a cover state detector to detect whether the cover is open or closed,
- the cover state detector comprising:
- a detection recess formed in the main body; and
- a projection formed on the inner surface of the cover, to engage the detection recess when the cover is closed.

3. The cover unit according to claim 2, wherein the rotation stopper prohibits the cover from rotating when the cover state detector detects that the cover is closed.

4. The cover unit according to claim 1, wherein the rotation stopper is disposed between the shaft and the deformable portion in a direction perpendicular to a direction of axis of rotation of the front cover and has a height substantially equivalent to a distance between the inner surface of the cover and a fringed edge of the opening in the main body when the rotation stopper prohibits the cover from rotating.

5. The cover unit according to claim 1, wherein the rotation stopper is disposed between the shaft and the deformable portion in a direction perpendicular to a direction of axis of rotation of the front cover and has a height substantially equivalent to a distance by which the deformable portion deforms, causing the engagement portion to push the engagement pawl of the push latch unit to lock and unlock the cover when the rotation stopper prohibits the cover from rotating.

6. The cover unit according to claim 1, wherein the cover comprises a planar body and a raised edge portion surrounding the planar body, and a pair of cutouts are formed in one side of the raised edge portion.

7. The cover unit according to claim 6, wherein the cutouts are positioned adjacent to the engagement portion of the cover.

8. The cover unit according to claim 1, wherein the rotation stopper projects from the inner surface of the cover and prohibits the cover from rotating by contacting a flanged edge of the opening in the main body.

9. The cover unit according to claim 1, wherein the rotation stopper is formed on a flanged edge of the opening in the main body and prohibits the cover from rotating by contacting an edge portion of the front cover in a direction of axis of rotation of the front cover.

10. The cover unit according to claim 1, incorporated in an electronic device.

11. The cover unit according to claim 1, incorporated in an image forming apparatus.

* * * * *